United States Patent
Kim et al.

(10) Patent No.: US 8,023,330 B2
(45) Date of Patent: Sep. 20, 2011

(54) METHOD OF ERASING A NONVOLATILE MEMORY DEVICE

(75) Inventors: Beom Sik Kim, Seoul (KR); Young Soo Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 308 days.

(21) Appl. No.: 12/361,783

(22) Filed: Jan. 29, 2009

(65) Prior Publication Data
US 2009/0290423 A1 Nov. 26, 2009

(30) Foreign Application Priority Data
May 23, 2008 (KR) .................. 10-2008-0048168

(51) Int. Cl.
*G11C 11/34* (2006.01)
(52) U.S. Cl. ......... 365/185.19; 365/185.18; 365/185.22; 365/185.24; 365/185.29; 365/185.33
(58) Field of Classification Search ............ 365/185.18, 365/185.19, 185.22, 185.24, 185.29, 185.33
See application file for complete search history.

(56) References Cited

U.S. PATENT DOCUMENTS

| | | | | |
|---|---|---|---|---|
| 6,134,140 A * | 10/2000 | Tanaka et al. | ............ | 365/185.03 |
| 6,307,784 B1 * | 10/2001 | Hamilton et al. | ........ | 365/185.22 |
| 2006/0044919 A1 * | 3/2006 | Taoka et al. | ............. | 365/230.03 |
| 2007/0058435 A1 * | 3/2007 | Chen et al. | ............... | 365/185.22 |

FOREIGN PATENT DOCUMENTS
KR  1020080007553 A  1/2008

* cited by examiner

*Primary Examiner* — Pho M Luu
*Assistant Examiner* — Tha-O Bui
(74) *Attorney, Agent, or Firm* — Kilpatrick Townsend & Stockton LLP

(57) ABSTRACT

In a method of erasing a nonvolatile memory device, an erase operation is performed on memory cells of a selected block. A first soft program operation is performed on the cells on which the erase operation has been performed. The erase operation and the first soft program operation are repeatedly performed by increasing an erase voltage by a first step voltage until a threshold voltage of the memory cells becomes lower than a first erase verify voltage. When the threshold voltage of the memory cells becomes lower than the first erase verify voltage, a second soft program operation is performed. The second soft program operation is repeatedly performed by increasing a soft program voltage by a second step voltage until a cell is programmed to have a soft program verify voltage.

8 Claims, 4 Drawing Sheets

METHOD OF ERASING A NONVOLATILE MEMORY DEVICE

CROSS-REFERENCES TO RELATED APPLICATIONS

The present application claims priority to Korean patent application number 10-2008-0048168, filed on May 23, 2008, which is incorporated by reference in its entirety.

BACKGROUND OF THE INVENTION

The present invention relates to a method of erasing nonvolatile memory devices.

Recently, there has been an increasing demand for nonvolatile memory devices, which can be programmed and erased electrically and do not need a refresh function of rewriting data at specific intervals.

A nonvolatile memory cell is an element that enables electrical program/erase operations. The program/erase operations are performed by changing the threshold voltage of the cell as electrons are moved by a strong electric field applied to a thin oxide layer.

In the erase operation of the nonvolatile memory device, there have been significant advancements. In the case in which only a single level cell program operation was performed, the influence of distributions of an erased cell on the program operation was not significant. However, as multi-level cell program methods are commercialized, one memory cell may be represented by several states. In order to ensure a margin of each state, efforts for narrowing the distributions have been made. This is described below in connection with the erase operation. As the distributions when the memory cells are erased become narrow, distributions after corresponding cells are programmed become narrow. Accordingly, it is necessary to improve the erase operation to narrow the cell distributions to the greatest extent after the erase operation is carried out.

BRIEF SUMMARY OF THE INVENTION

The present invention is directed towards a method of erasing nonvolatile memory devices, which can narrow distributions of memory cells after an erase operation is performed.

In accordance with an aspect of the present invention, a method of erasing a nonvolatile memory device is provided. According to this method, an erase operation is performed on the memory cells of a selected block. A first soft program operation is performed on the cells on which the erase operation has been performed. The erase operation and the first soft program operation are repeatedly performed by increasing an erase voltage by a first step voltage until a threshold voltage of the memory cells becomes lower than a first erase verify voltage. When the threshold voltage of the memory cells becomes lower than the first erase verify voltage, a second soft program operation is performed. The second soft program operation is repeatedly performed by increasing a soft program voltage by a second step voltage until a cell is programmed to have a soft program verify voltage or higher.

In accordance with another aspect of the present invention, a method of erasing a nonvolatile memory device is provided. According to this method, a first soft program operation is performed on memory cells after an erase operation is performed on the memory cells. The erase operation and the first soft program operation are repeatedly performed by increasing an erase voltage by a first step voltage until a threshold voltage of the memory cells becomes lower than a first erase verify voltage. When the threshold voltage of the memory cells becomes lower than the first erase verify voltage, a second soft program operation is performed. The second soft program operation is repeatedly performed by increasing a soft program voltage by a second step voltage until a cell is programmed to have a soft program verify voltage.

DESCRIPTION OF SPECIFIC EMBODIMENT

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the present invention. The present invention is defined by the scope of the claims.

Figure 1:
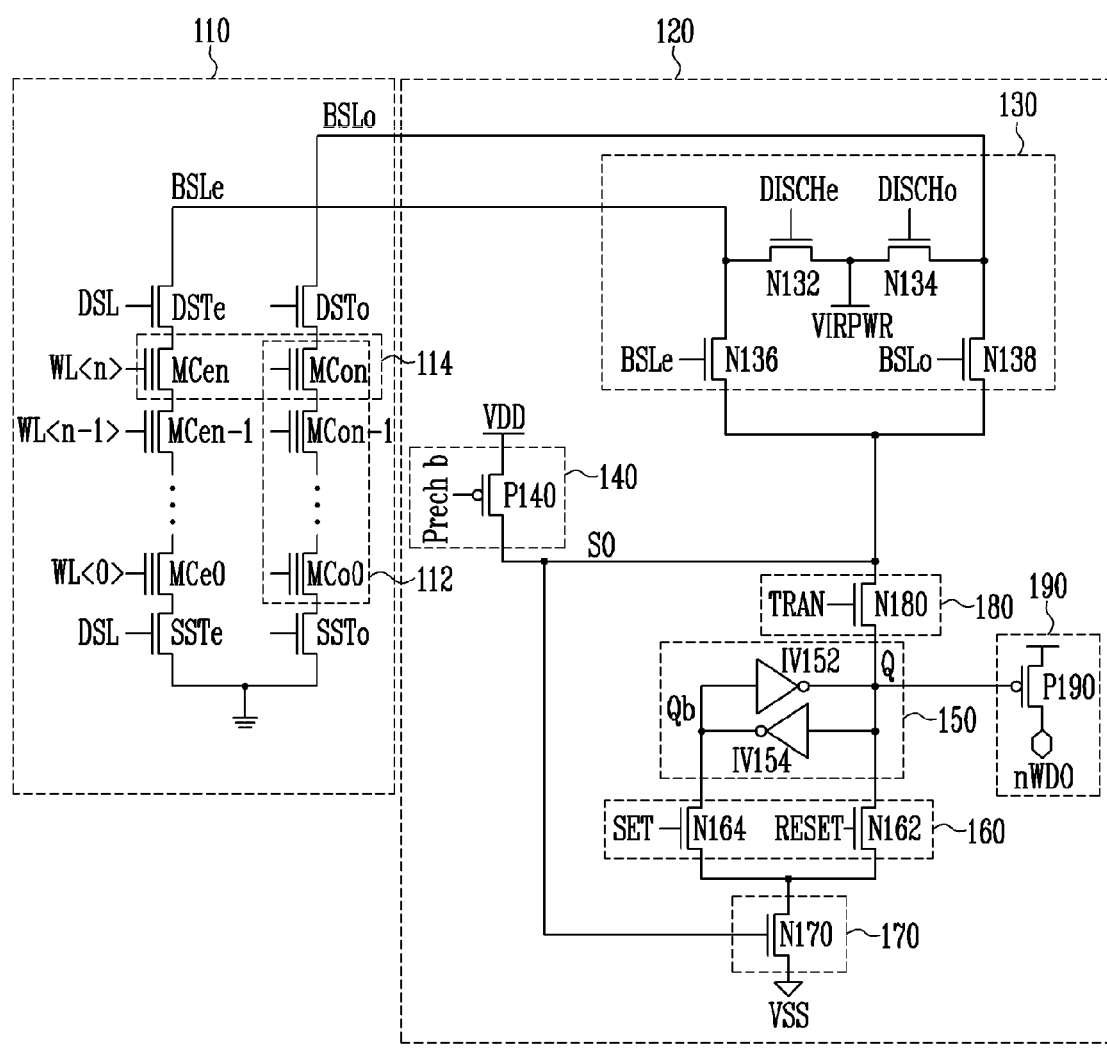
FIG. 1 is a circuit diagram of a nonvolatile memory device to which the present invention is applied.

FIG. 1 is a circuit diagram of a nonvolatile memory device to which the present invention is applied.

A nonvolatile memory device 100 includes a memory cell array 110 having a plurality of memory cells, and a page buffer 120. The page buffer is coupled to the memory cells, and is configured to program specific data into the memory cells and to read data stored in the memory cells.

The memory cell array 110 includes memory cells MC0 to MCn for storing data, word lines WL<0:n> for selecting and activating the memory cells, and bit lines BLe, BLo for inputting/outputting data of the memory cells. The plurality of word lines and bit lines are arranged in matrix form.

The memory cell array 110 includes drain select transistors DSTe, DSTo connected between the bit lines and the memory cells, and source select transistors SSTe, SSTo connected between a common source line and the memory cells. The memory cell array 110 further includes a plurality of memory cells connected in series between the source select transistors SSTe, SSTo and the drain select transistors DSTe, DSTo. The memory cells are referred to as a cell string 112.

The gates of the memory cells are connected to the word lines. A collection of memory cells commonly coupled to the same word line is called a page 114. A plurality of the strings connected to the respective bit lines is connected in parallel to the common source line, thereby constituting a block.

The page buffer 120 includes a bit line select unit 130, a sense node precharge unit 140, a data latch unit 150, a data setting unit 160, a sense node sensing unit 170, a data transmission unit 180, and a verify signal output unit 190. The bit line select unit 130 selectively connects a bit line, coupled to a specific cell, to a sense node SO. The sense node precharge unit 140 applies the sense node with a power supply voltage of a high level. The data latch unit 150 temporarily stores data to be programmed into a specific cell or temporarily stores data read from a specific cell. The data setting unit 160 inputs data to the data latch unit. The sense node sensing unit 170 applies a ground voltage to a specific node of the data latch unit according to a level of the sense node. The data transmission unit 180 applies data stored in the data latch unit to the sense node. The verify signal output unit 190 informs whether verification has been completed based on data stored in the data latch unit 150.

The bit line select unit 130 includes a NMOS transistor N136 for connecting an even bit line BLe and the sense node SO in response to a first bit line select signal BSLe, and a NMOS transistor N138 for connecting an odd bit line BLo and the sense node SO in response to a second bit line select signal BSLo.

The bit line select unit 130 further includes a virtual power input terminal for applying a virtual power VIRPWR of a specific level, a NMOS transistor N132 for connecting the even bit line BLe and the virtual power input terminal in response to a first discharge signal DISCHe, and a NMOS transistor N134 for connecting the odd bit line BLo and the virtual power input terminal in response to a second discharge signal DISCHo.

The sense node precharge unit 140 applies a high level voltage VDD to the sense node SO in response to a precharge signal Prech b. The sense node precharge unit 140 includes a PMOS transistor P140 connected between a power supply voltage terminal VDD and the sense node. Accordingly, the sense node precharge unit 140 applies the power supply voltage of a high level to the sense node SO in response to the precharge signal of a low level.

The data latch unit 150 temporarily stores data to be programmed into a specific cell, or temporarily stores data read from a specific cell. The data latch unit 150 includes a first inverter IV152 and a second inverter IV154. An output terminal of the first inverter IV152 is coupled to an input terminal of the second inverter IV154, and an output terminal of the second inverter IV154 is coupled to an input terminal of the first inverter IV152.

A node where the output terminal of the first inverter IV152 and the input terminal of the second inverter IV154 are connected is called a first node Q, and a node where the output terminal of the second inverter IV154 and the input terminal of the first inverter IV152 are connected is called a second node Qb.

For example, when high-level data is applied to the first node Q, the corresponding data is inverted by the second inverter and, therefore, low-level data is applied to the second node Qb. The low-level data is inverted by the first inverter again and the high-level data, which was applied to the first node Q, remains intact, resulting in a data retention effect. In contrast, when low-level data is applied to the first node Q, the corresponding data is inverted by the second inverter and high-level data is then applied to the second node Qb. The high-level data is inverted by the first inverter again and, therefore, the low-level data, which was applied to the first node Q, remains intact, resulting in a data retention effect.

The data setting unit 160 includes a first data setting transistor N162 for applying a ground voltage to the first node Q of the data latch unit 150, and a second data setting transistor N164 for applying a ground voltage to the second node Qb of the data latch unit 150.

The first data setting transistor N162 is connected between the sense node sensing unit 170 and the first node Q, and applies the ground voltage, transferred from the sense node sensing unit 170, to the first node Q in response to a first data setting signal RESET.

The second data setting transistor N164 is connected between the sense node sensing unit 170 and the second node Qb, and transfers the ground voltage, transferred from the sense node sensing unit 170, to the second node Qb in response to a second data setting signal SET.

The sense node sensing unit 170 applies the ground voltage to the data setting unit 160 according to a voltage level of the sense node SO. The sense node sensing unit 170 includes a NMOS transistor N170 connected between the data setting unit 160 and the ground terminal VSS.

Thus, the sense node sensing unit 170 applies the ground voltage to the data setting unit 160 according to a voltage level of the sense node SO. However, when a voltage level of the sense node is a high level, the sense node sensing unit 170 applies the ground voltage to the data setting unit 160. If the first data setting signal RESET of a high level is applied, the ground voltage is applied to the first node Q. It is considered that low-level data has been applied to the first node Q. However, if the second data setting signal SET of a high level is applied, the ground voltage is applied to the second node Qb. It is considered that high-level data has been applied to the first node.

The data transmission unit 180 selectively applies data, stored in the first node Q of the data latch unit 150, to the sense node SO. The data transmission unit 180 includes a data transmission transistor N180 for selectively connecting the first node Q and the sense node SO.

The verify signal output unit 190 outputs a signal, indicating whether verification has been completed, according to data stored in the first node Q of the data latch unit 150. The verify signal output unit 190 includes a PMOS transistor P190 for transferring the power supply voltage of a high level to a verify signal output terminal nWDO according to a signal of the first node Q. However, according to another embodiment, a NMOS transistor for transferring the power supply voltage of a high level to the verify signal output terminal nWDO according to a signal of the second node Qb may be used, instead of the PMOS transistor P190.

Figure 2A:
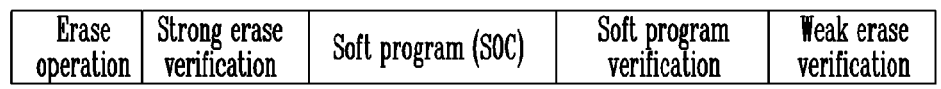
FIGS. 2A and 2B are views illustrating the concept of an erase operation in a typical nonvolatile memory device.
Figure 2B:
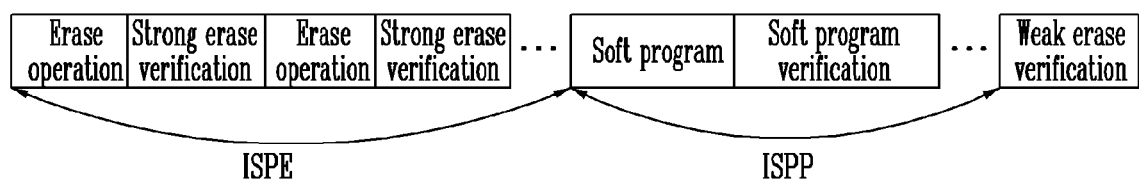

FIGS. 2A and 2B are views illustrating the concept of an erase operation in a typical nonvolatile memory device.

First, the method of FIG. 2A is described. An erase operation is first performed on the memory cells. For the erase operation, typically, a voltage of 0V is applied to the gate of each memory cell and a high voltage of approximately 20V is applied to a bulk. Accordingly, electrons stored in each cell are drained toward a channel by Fowler-Nordheim (F-N) tunneling, so that the state of each memory cell becomes an erase state. This erase operation is performed on a per block basis.

After the erase operation is carried out, strong erase verification for checking whether the cells are in an erase state is performed. A reference voltage of 0V is applied to the word lines of the memory cells, and it is then determined whether the threshold voltages of the cells are lower than 0V. This process is almost the same as a typical program verify operation except that the reference voltage of 0V is applied to the word lines of each cell. If, as a result of the determination, the threshold voltages of the cells are lower than 0V, corresponding cells are turned on by applying a voltage of 0V to the word lines of each cell. Thus, a current path is established through each cell string. Consequently, the sense node precharged to a high level is discharged through the current path.

A soft program (or softprogram on chip (SOC)) operation is then performed. The soft program is an operation for moving the distributions such that the distributions of erased cells approach 0V. The distributions of the erased cells are moved upwardly by applying a program voltage to the erased cells.

A verify operation is performed on the soft program operation. Typically, a specific voltage lower than 0V is selected. When cells are programmed to have a corresponding voltage or higher, the soft program is determined to be completed.

Weak erase verification is then carried out. The weak erase verify operation is almost the same as the strong erase verify operation except that the verify reference voltage applied to the word lines is slightly higher than that of the strong erase verify operation. In the weak erase verification, the verify reference voltage of approximately 0 to 0.5V is applied. If, as a result of the verification, any cells are not in an erase state, the cells are considered as failed cells, and, therefore, a block including the failed cells is treated as a bad block.

The method of FIG. 2B is described below. Unlike the method of FIG. 2A, at the time of an erase operation, an incremental step pulse erase (ISPE) operation is executed. That is, the erase operation is performed by repeatedly applying a relatively low voltage, unlike the method of FIG. 2A in which a high voltage is applied to the bulk. Further, the erase operation is performed by increasing an erase voltage whenever the erase operation is repeated. That is, after the erase operation is performed by applying a first erase voltage, a strong erase verify operation is performed. After the erase operation is performed by applying a second erase voltage for which the erase voltage has been increased by a step voltage, a strong erase verify operation is performed.

If the cells of a target erase block are in an erase state by consistently repeating the application of the erase voltage and the strong erase verify operation, the erase operation is completed.

After the erase operation according to the ISPE operation is carried out, a soft program operation method is performed according to an incremental step pulse program (ISPP). The soft program operation method is almost the same as a typical program operation except that a program voltage is low, unlike a typical program operation. That is, after the soft program operation is performed by applying a first soft program voltage, a soft program verify operation is carried out. A soft program operation is then performed by applying a second soft program voltage for which the soft program voltage has been increased by a step voltage. A soft program verify operation is then carried out.

If any cells have been programmed to have a specific verify voltage lower than 0V as a result of consistently repeating the application of the soft program voltage and the soft program operation, the soft program operation is completed.

A weak erase verification is then carried out. The weak erase verify operation is almost the same as the strong erase verify operation except that a verify reference voltage applied to the word lines is slightly higher than that of the strong erase verify operation. In the weak erase verify operation, the verify reference voltage of approximately 0 to 0.5V is applied. If, as a result of the verification, any cells are not in an erase state, the cells are treated as failed cells and, therefore, a block including the failed cells is treated as a bad block.

The effect of each of the erase operations are described below.

Figure 3A:
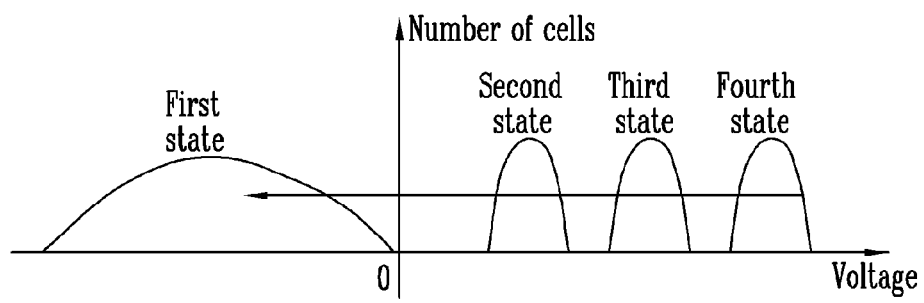
FIGS. 3A and 3B are graphs showing a change of the distributions of threshold voltages in the erase operation of a typical nonvolatile memory device.
Figure 3B:
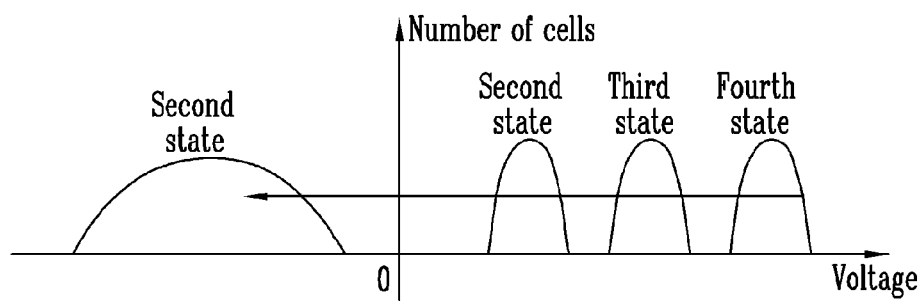

FIGS. 3A and 3B are graphs showing a change of threshold voltage distributions in an erase operation of a typical nonvolatile memory device.

FIG. 3A shows that the erase operation according to the method of FIG. 2A was carried out. From FIG. 3A, it can be seen that a cell distribution after the erase operation is wide (a first state). FIG. 3B shows that the erase operation according to the method of FIG. 2B was carried out. From FIG. 3B, it can be seen that a cell distribution after the erase operation is narrowed compared with the erase operation according to the method of FIG. 2A (a second state). As a result of the erase operation using ISPE, the distributions of the erased cells were further narrowed when a low voltage was applied several times, compared with when a high voltage was applied once, unlike the method of FIG. 2A. However, the present invention proposes a method of further narrowing the distribution of an erased cell.

Figure 4:
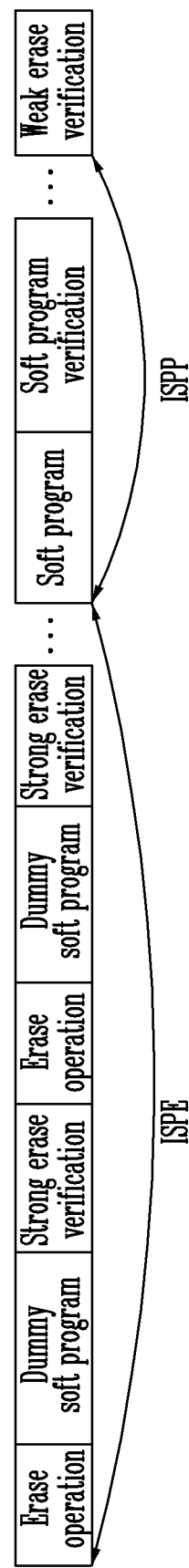
FIG. 4 is a view illustrating the concept of an erase operation of a nonvolatile memory device in accordance with an embodiment of the present invention.
Figure 5:
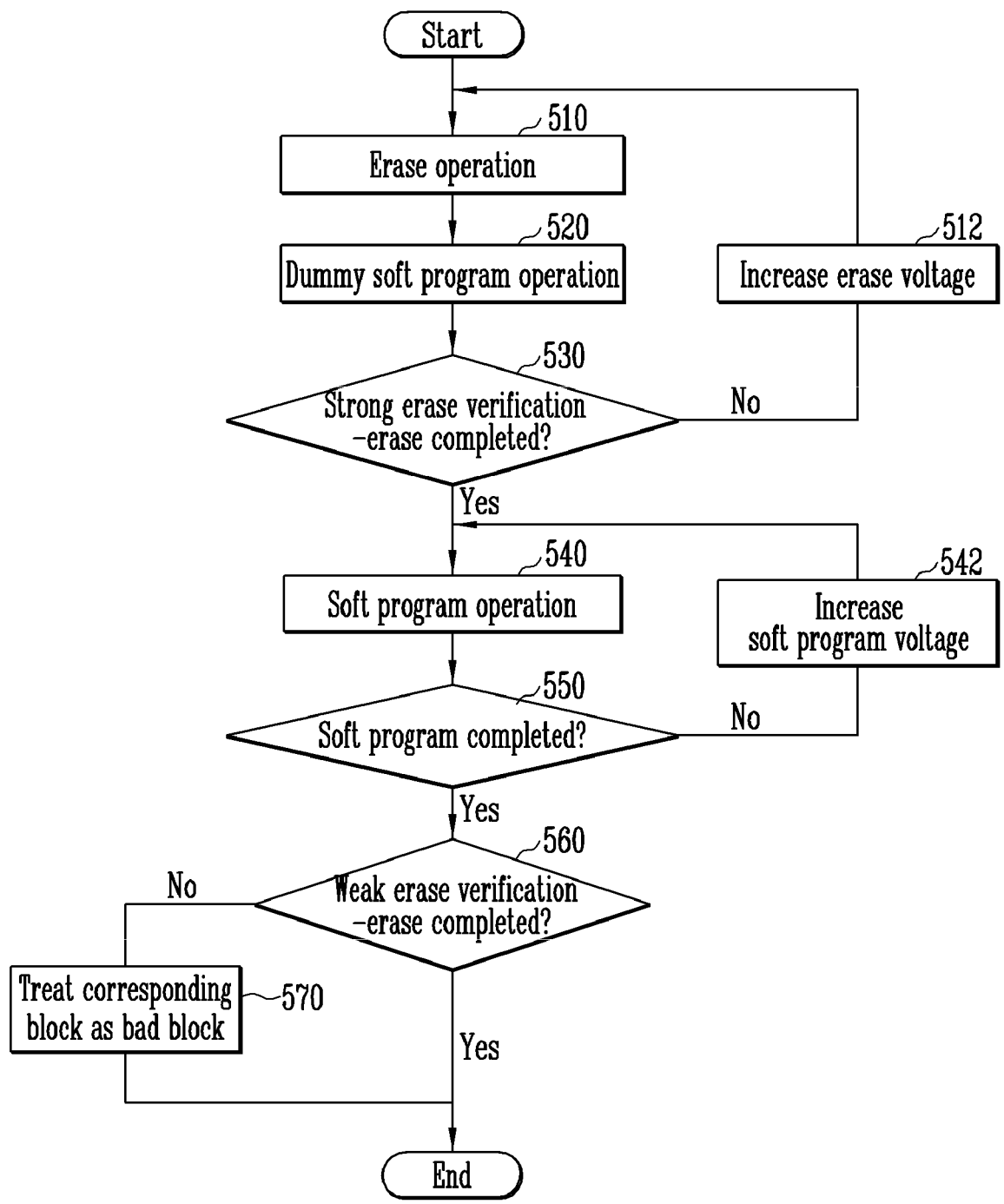
FIG. 5 is a flowchart illustrating a method of erasing a nonvolatile memory device in accordance with an embodiment of the present invention.

FIG. 4 is a view illustrating the concept of an erase operation of a nonvolatile memory device in accordance with an embodiment of the present invention. FIG. 5 is a flowchart illustrating a method of erasing a nonvolatile memory device in accordance with an embodiment of the present invention.

Referring to FIG. 4, according to the present invention, a dummy soft program operation is performed during the erase operation using ISPE. That is, the dummy soft program operation is performed between the erase operation and the strong erase verify operation. After one erase operation is carried out by applying an erase voltage, the distributions of the cells are made to have a state close to 0V by applying a soft program voltage irrespective of whether the erase operation has been completed. If the soft program operation is performed during the erase operation as described above, the distributions of erased cells can be further narrowed.

This process is described below in more detail with reference to FIG. 5.

An erase operation according to ISPE is first carried out in step 510. A first erase voltage is set to approximately 12 to 15V, and a step voltage ranges from 0.1 to 1.5V. The erase operation is performed by applying the word lines of each memory cell with a voltage of 0V and the erase voltage to the bulk of a memory cell. The erase operation is performed based on the above FN tunneling effect.

A dummy soft program operation is then carried out in step 520. The dummy soft program operation is almost the same as a soft program operation subsequently performed in step 540. That is, the dummy soft program operation is performed by applying a program voltage of approximately 10 to 12V to the word lines of the memory cells. However, after the dummy soft program operation, an additional verify operation is not carried out. The threshold voltages of the memory cells are raised by the dummy soft program operation. Accordingly, the distributions of cells on which the erase operation has been performed can be narrowed.

It is then verified whether the cells on which the operations (steps 510, 520) were performed have been erased in step 530. That is, it is verified whether the threshold voltages of the cells have been programmed to 0V or less by applying a first erase verify voltage of 0V to the word lines of the memory cells.

If, as a result of the verification in step 530, any cells have not been erased, the erase voltage is raised by a step voltage in step 512, and the erase operation (step 510) and the dummy soft program operation (step 520) are repeatedly performed. The step voltage may be set to approximately 0.1 to 1.5V.

If, as a result of the verification in step 530, the memory cells within a target erase block have been erased, a soft program operation is carried out in step 540. The soft program operation is almost the same as the above dummy soft program operation except that, after erasure is completed, the soft program operation and the verify operation are performed.

After the soft program operation is performed, a verify operation on the soft program operation is carried out in step 550. In the state in which a specific voltage lower than 0V (hereinafter referred to as a 'soft program verify voltage') is set and any cells are programmed to have a soft program verify voltage or higher, it is determined that the soft program operation has been completed. In more detail, if a specific cell is programmed to have a soft verify voltage or higher, the corresponding cell is turned on, so that the current path of a cell string to which the corresponding cell belongs is precluded. Thus, the voltage level of a bit line precharged to a high level remains intact, which is therefore transferred to the sense node. The voltage level of the sense node is a high level and, therefore, data stored in a register is changed. If there is any cell having data that has been changed among the page buffers, the cell is determined to have been programmed to have the soft program verify voltage or higher.

If no cell has been programmed to the soft program verify voltage or higher, the soft program voltage is raised by a step voltage in step 542 and the soft program operation is then performed repeatedly in step 540. The step voltage may be set to approximately 0.1 to 1.5V.

After the soft program operation is performed in step 550, it is verified whether the cells on which the soft program operation was performed have all been erased in step 560. That is, it is determined whether the threshold voltages of the cells are lower than a second erase verify voltage by applying the second erase verify voltage of 0 to 0.5V to the word lines of the memory cells.

If, as a result of the verification in step 560, any cell is programmed to have a voltage higher than the second erase verify voltage, the corresponding cell is treated as a failed cell and, therefore, a block including the failed cell is treated as a bad block, in step 570. However, if, as a result of the verification in step 560, the cells have a threshold voltage lower than the second erase verify voltage, the cells are treated as normal cells and, therefore, the erase operation is finished.

As described above, a dummy soft program operation is performed between respective erase operations, so that distributions of the target erase cells can be narrowed.

In accordance with the construction of the present invention, a soft program operation is performed even during an erase operation. Accordingly, distributions of threshold voltages of cells on which an erase operation has been performed can be narrowed.

The embodiment disclosed herein has been proposed to allow a person skilled in the art to easily implement the present invention, and the person skilled in the art may implement the present invention in various ways. Therefore, the scope of the present invention is not limited by or to the embodiment described above, and should be construed to be defined only by the appended claims and their equivalents.

What is claimed is:

1. A method of erasing a nonvolatile memory device, the method comprising:
    performing an erase operation on memory cells of a selected block;
    performing a dummy soft program operation on the cells on which the erase operation has been performed;
    performing a first erase verify operation that determines whether a threshold voltage of the memory cells is lower than a first erase verify voltage;
    repeatedly performing the erase operation and the dummy soft program operation by increasing an erase voltage by a first step voltage until the threshold voltage of the entire memory cells becomes lower than the first erase verify voltage;
    in the event that the threshold voltage of the entire memory cells becomes lower than the first erase verify voltage, performing a soft program operation;
    performing a soft program verify operation that determines whether the threshold voltage of the memory cells is higher than a soft program verify voltage; and
    repeatedly performing the soft program operation by increasing a soft program voltage by a second step voltage until a cell is programmed to have the soft program verify voltage.

2. The method of claim 1, further comprising:
    determining whether the threshold voltage of the memory cells is lower than a second erase verify voltage; and
    in the event that a cell has a threshold voltage higher than the second erase verify voltage, treating a block including the cell as a bad block.

3. The method of claim 1, wherein the repetitive execution of the erase operation and the dummy soft program operation comprises:
    in the event that a cell has a threshold voltage higher than the first erase verify voltage, increasing the erase voltage by the first step voltage.

4. The method of claim 1, wherein the repetitive execution of the soft program operation comprises:
    when the threshold voltage of the entire memory cells is lower than the soft program verify voltage, increasing the soft program voltage by the second step voltage.

5. A method of erasing a nonvolatile memory device, the method comprising:
    performing a dummy soft program operation on memory cells after an erase operation is performed on the memory cells;
    performing a first erase verify operation that determines whether a threshold voltage of the memory cells is lower than a first erase verify voltage;
    repeatedly performing the erase operation and the dummy soft program operation by increasing an erase voltage by a first step voltage until the threshold voltage of the entire memory cells becomes lower than the first erase verify voltage;
    in the event that the threshold voltage of the entire memory cells becomes lower than the first erase verify voltage, performing a second soft program operation;
    performing a soft program verify operation that determines whether the threshold voltage of the memory cells is higher than a soft program verify voltage; and
    repeatedly performing the soft program operation by increasing a soft program voltage by a second step voltage until a cell is programmed to have the soft program verify voltage.

6. The method of claim 5, further comprising:
    determining whether the threshold voltage of the memory cells is lower than a second erase verify voltage; and
    in the event that a cell has a threshold voltage higher than the second erase verify voltage, treating a block including the cell as a bad block.

7. The method of claim 5, wherein the repetitive execution of the erase operation and the dummy soft program operation comprises:
    in the event that a cell has a threshold voltage higher than the first erase verify voltage, increasing the erase voltage by the first step voltage.

8. The method of claim 5, wherein the repetitive execution of the soft program operation comprises:
    when the threshold voltage of the entire memory cells is lower than the soft program verify voltage, increasing the soft program voltage by the second step voltage.

* * * * *